(12) United States Patent
Sobchak et al.

(10) Patent No.: US 7,929,650 B2
(45) Date of Patent: Apr. 19, 2011

(54) AGC FOR NARROWBAND RECEIVERS

(75) Inventors: Charles L. Sobchak, Davie, FL (US); Mahibur Rahman, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 1580 days.

(21) Appl. No.: 11/252,525

(22) Filed: Oct. 18, 2005

(65) Prior Publication Data

US 2007/0086547 A1    Apr. 19, 2007

(51) Int. Cl.
*H04L 27/08* (2006.01)
(52) U.S. Cl. .......................................... 375/345; 455/69
(58) Field of Classification Search .................. 375/345; 455/69, 552
See application file for complete search history.

(56) References Cited

U.S. PATENT DOCUMENTS

| | | | |
|---|---|---|---|
| 5,742,899 A | 4/1998 | Blackburn et al. | |
| 5,745,531 A | 4/1998 | Sawahashi et al. | |
| 5,999,578 A | 12/1999 | Ha | |
| 6,075,978 A | 6/2000 | Tsumura | |
| 6,088,583 A | 7/2000 | Shimizu et al. | |
| 6,172,559 B1 | 1/2001 | Yamaguchi | |
| 6,175,746 B1 | 1/2001 | Nakayama et al. | |
| 6,418,303 B1 | 7/2002 | Blackburn et al. | |
| 6,498,927 B2 | 12/2002 | Kang et al. | |
| 6,510,188 B1 | 1/2003 | Isaksen et al. | |
| 6,571,083 B1 * | 5/2003 | Powell et al. | 455/69 |
| 6,625,433 B1 * | 9/2003 | Poirier et al. | 455/232.1 |
| 6,646,500 B2 | 11/2003 | Li et al. | |
| 6,748,201 B2 | 6/2004 | Black et al. | |
| 6,799,024 B2 | 9/2004 | Wang et al. | |
| 7,065,335 B2 | 6/2006 | Ben-Ayun et al. | |
| 7,116,955 B2 | 10/2006 | Schaffer et al. | |
| 7,127,222 B2 | 10/2006 | Kim et al. | |
| 7,268,715 B2 | 9/2007 | Guimaraes | |
| 2001/0053680 A1 | 12/2001 | Yamanaka et al. | |
| 2002/0045461 A1 * | 4/2002 | Bongfeldt | 455/522 |
| 2002/0131533 A1 | 9/2002 | Koizumi | |
| 2002/0137488 A1 | 9/2002 | Mitama | |
| 2003/0012313 A1 | 1/2003 | Husted et al. | |
| 2003/0202496 A1 | 10/2003 | Klug et al. | |
| 2004/0009758 A1 | 1/2004 | Graham et al. | |
| 2004/0097208 A1 | 5/2004 | Kasperkovitz | |
| 2005/0003783 A1 | 1/2005 | Ben-Ayun et al. | |
| 2005/0047523 A1 | 3/2005 | Ruelke et al. | |
| 2005/0276358 A1 | 12/2005 | Pipilos | |
| 2006/0003726 A1 | 1/2006 | Razzell | |
| 2006/0222116 A1 * | 10/2006 | Hughes et al. | 375/345 |
| 2009/0135971 A1 | 5/2009 | Takatz et al. | |

* cited by examiner

*Primary Examiner* — Shuwang Liu
*Assistant Examiner* — Michael R Neff (57) ABSTRACT

An automatic gain control (AGC) system for a receiver and corresponding method facilitate AGC in a receiver. The automatic gain control system includes an on-channel signal detector 123 configured to provide an on-channel signal level indication corresponding to a narrow band on-channel signal and a wideband signal detector 121 configured to provide a wideband signal level indication corresponding to a wideband signal, where the wideband signal includes the narrow band on-channel signal. Further included is a controller 149 that is coupled to the wideband signal level indication and the on-channel signal level indication and that is configured to provide a gain control signal corresponding to the wideband signal level and one or more of a plurality of states of the receiver.

17 Claims, 5 Drawing Sheets

AGC FOR NARROWBAND RECEIVERS

FIELD OF THE INVENTION

This invention relates in general to communication receivers and more specifically to an automatic gain control (AGC) system for receivers with minimal analog selectivity that are arranged to receive relatively narrowband signals.

BACKGROUND OF THE INVENTION

Automatic gain control or AGC systems are known and widely used. However present communications systems being developed and proposed, such as frequency hopped systems where the channel frequency varies relatively often or time division multiple access systems where a receiver must acquire the signal quickly and relatively often can present unique problems. These problems may be exacerbated where a particular received or on-channel signal can be relatively narrow in bandwidth. Conventional AGC systems normally operate primarily on an on-channel signal to control receiver gain in order to establish an appropriate on-channel signal level. Unfortunately, the required fast attack times necessitated with rapid frequency changes or time slotted periods of receiver activity can be at odds with the response times for conventional on-channel AGC systems.

Receiver architectures are evolving and due in part to economic pressures, less selectivity is being incorporated in receiver front ends and intermediate frequency (IF) stages. Practitioners are opting instead to incorporate the selectivity in later digital processing stages. Unfortunately that means a broader band of signals may be present in the front ends, IF stages, or analog to digital converter(s) (ADC) (used to convert from analog received signals to the digital domain). The chances that the front ends and particularly later receiver stages such as IF stages or ADCs may be overloaded by a large wideband (on-channel and adjacent or near channel signals has increased with this reduction in front end selectivity. This may cause overloading conditions (exceeding dynamic range) for cost effective ADCs and additional time delays for on-channel AGC systems to operate.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

In overview, the present disclosure concerns communications systems and equipment that provide service to communications units or more specifically users thereof operating therein. More particularly various inventive concepts and principles embodied in apparatus and methods for providing automatic gain control (AGC) systems for receivers in communication units, where the AGC systems are arranged for a fast response time using wideband signal levels as well as on channel signal levels are discussed and described. The systems and receivers of particular interest are those being developed and deployed where a fast response time for the AGC systems may be required, such as systems using frequency hopped or TDMA (time division multiple access) based air interface protocols and other air interface parameters (channel bandwidth) that can contribute to excess AGC system response times. Note that the concepts and principles according to the present invention, while described in the context of a receiver or system suitable for operation in the Family Radio Service (FRS) or Industrial, Scientific, and Medical (ISM) frequency bands, are believed to be applicable in many systems in the communication field where rapid AGC response may be required, e.g., in order to avoid excessive overload situations and the like due to adjacent channel signals, noise, or other undesirable artifacts.

As further discussed below various inventive principles and combinations thereof are advantageously employed to detect wideband signal levels (including an on-channel signal level) to rapidly effect a controlled gain reduction and thus avoid any detrimental impact that can result from a relatively slower AGC response if only the on-channel signal level is used. This inventive AGC system and techniques can be particularly advantageously utilized within an exemplary frequency hopped receiver, thereby alleviating various problems associated with known AGC systems and facilitating lower cost higher performance receivers while still providing an autonomous AGC system provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Figure 1:
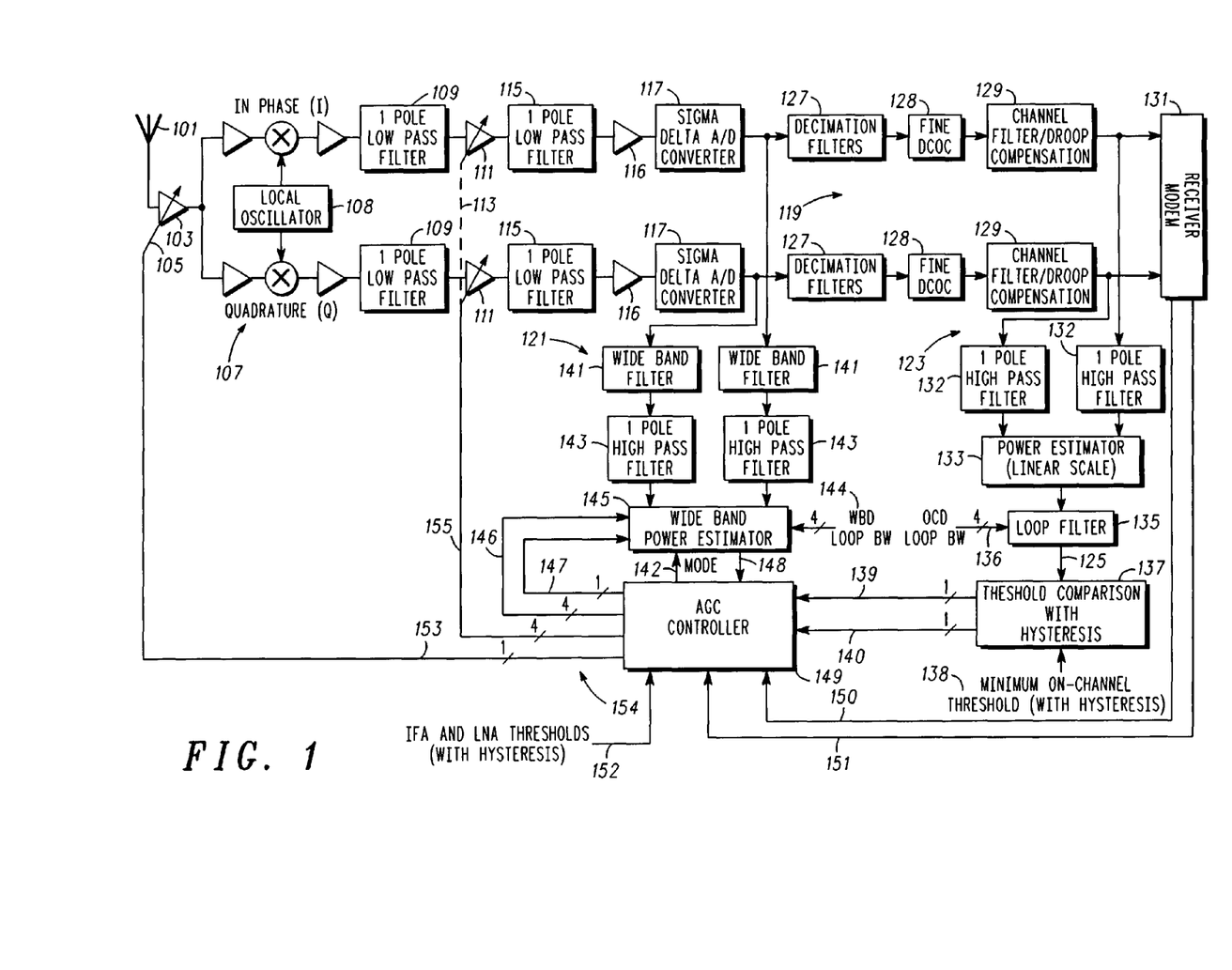
FIG. 1 depicts, in an exemplary receiver, an exemplary block diagram embodiment of an automatic gain control (AGC) system in accordance with the present invention.

Much of the inventive functionality and many of the inventive principles are best implemented with or in integrated circuits (ICs) and software or firmware instructions, such as custom or semi-custom ICs, e.g., application specific ICs. It is expected that one of ordinary skill, notwithstanding possibly significant effort and many design choices motivated by, for example, available time, current technology, and economic considerations, when guided by the concepts and principles disclosed herein will be readily capable of generating such instructions and ICs with minimal experimentation. Therefore, in the interest of brevity and minimization of any risk of obscuring the principles and concepts according to the invention, further discussion of such software and ICs, if any, will be limited to the essentials with respect to the principles and concepts of the preferred embodiments Referring to FIG. 1, a portion of an exemplary receiver including an exemplary embodiment of an automatic gain control (AGC) system will be discussed and described. The receiver portion of FIG. 1 is a receiver front end from the antenna through channel filters and receiver modem, such as a receiver for ISM services or other relatively narrow channel bandwidth receiver suitable for high levels of integration and processing complex modulation signals. In one or more embodiments the receiver is arranged to receive signals using a frequency hopping air interface protocol in the frequency band between 902-928 MHz where an FM (Frequency Modulated) modulation constellation and an appropriate channel spacing, e.g., 10s of KHz, is used The receiver includes or is inter-coupled to a generally known antenna system 101 at one or more radio frequency (RF) amplifiers or low noise amplifiers (LNAs) 103. The LNA(s) 103 and associated circuitry include a switch arrangement 105 that allows the LNA(s) to be controllably used as an attenuator stage or a controlled gain stage operable to switch a fixed amount, e.g., in one embodiment 20 dB, of attenuation or gain into the receive path. More specifically in one embodiment the switch arrangement when operated results in the LNA switching from 13 dB to −7 dB gain, e.g., foregoes 20 dB of gain for the received signal. The LNA 103 is coupled at an output to a mixer stage 107 (including pre and post mixer amplifiers as shown) for down conversion of the radio frequency signal to an intermediate frequency (IF) or baseband frequency as is known. The mixer stage is a complex mixer that is driven by a local oscillator 108 and provides quadrature signal components, e.g., in phase (I) (upper functions or channel in FIG. 1) and quadrature (Q) (lower functions or channel in FIG. 1) signal components as is known. The receiver is tuned or set to a given channel by adjusting the frequency of the local oscillator (typically via some form of known synthesizer and general controller—neither specifically shown). In one or more embodiments the mixer is a direct conversion mixer, i.e., directly converts the received signal to a "0" frequency IF signal and has a nominal 3 dB corner frequency at 35 KHz.

From the mixer stage 107, the down converted receiver signal is filtered by a low pass filter 109. Specifically the I channel and Q channel signals are filtered by respective low pass filters 109, such as a resistor capacitor filter, e.g., active filter, with a corner frequency set to accommodate the bandwidth of any signal of interest, e.g., 3 dB corner at 100 KHz in one embodiment. The outputs or I and Q channels from the low pass filter 109 are coupled to respective Intermediate Frequency (IF) amplifiers 111. The IF amplifier is a variable gain amplifier that is operable to amplify a received signal in accordance with a gain control signal. The IF amplifier has variable or controllable gain, via a gain control input 113, and can be utilized as a variable attenuator, responsive to a variable control signal, to provide a variable amount of attenuation or gain for the received signal (I and Q channel). The IF amplifier 11 in some embodiments is arranged to provide approximately −25.5 dB to +12 db (37.5 dB range in 16 discrete steps) of attenuation or gain control in nominally 2.5 dB steps for the I and the Q channel signal. The outputs of the IF amplifier 111 are coupled to a further low pass filter 115, with one each for the I and Q channel. In one or more embodiments these low pass filters are a single pole filter with a nominal 3 dB corner frequency of 100 KHz. Note that these filters may be realized as active filters. The outputs of the low pass filters are coupled to a relatively broad band amplifier or buffer 116. In one exemplary embodiment an analog based integrated circuit includes the mixer stage 107 through the low pass filter 115 and broad band amplifier 116.

The outputs of the broad band amplifier 116 are coupled, in one or more embodiments, to a digital integrated circuit that includes Analog to Digital converters, various digital circuitry, and digital signal processing based functionality. Specifically in an exemplary embodiment, the broad band amplifier 116 outputs are coupled or applied to an analog to digital converter (ADC) 117, with one ADC each for the I and the Q channel signal. In one exemplary embodiment suitable for various receivers, the ADC is a sigma delta based ADC that includes a noise reducing device and provides,e.g., 6 bit samples at a 8.4 million Samples per second (MS/s) rate (6 bit samples at 9.6 MS/s in another exemplary embodiment) although the principles and concepts apply regardless of the particulars of the ADC sampling. The outputs from the ADC 117 are coupled to a normal receive data path 119 and a wideband processing path or wideband signal detector 121. It will also be appreciated that very little selectivity (filtering) by receiver standards is provided in front of the ADC 117 and thus the ADC is subject to being overloaded (input signal exceeding the maximum dynamic range) with strong signals at the antenna.

The receive data path 119 supplies most of the receiver selectivity and may also be viewed as included in an on-channel signal detector 123 that can be arranged and configured to provide an on-channel signal level indication, for example, at terminal 125. This on-channel signal detector 123 can be referred to as an on-channel AGC detector or a narrow band AGC detector. The receive data path 119 includes an on-channel decimation filter 127 that filters and decimates by a factor of 25, the I and Q channel signals from the ADC 117. The decimation filter in one or more embodiment includes two stages with a first stage comprising a $6^{th}$ order comb filter with shifted zeros with a nominal 3 dB bandwidth of 40 KHz (varies with sampling frequency) that provides an output comprising 16 bit samples at 336 KS/s (384 KS/s when sampling rate is 9.6 MS/s). The second stage is another $6^{th}$ order comb filter with a nominal 3 dB corner frequency (bandwidth) of 20 KHz. The output signal from the on-channel decimation filter, i.e., second stage, is 16 bit samples at a rate of 96 KS/s.

The decimation filter 127 provides an I and Q input signal to a known DC level offset correction function 128 where any DC component is corrected for or reduced. The output from the offset correction function is coupled to a channel equalization filter 129, specifically to an I and Q channel equalization filter that is arranged to compensate for any droop and the like that may be caused by filtering in the receiver lineup. The channel equalization filter in one or more embodiments has a 3 dB bandwidth of 22.5 KHz and 60 dB rejection at 30 KHz. The output signal from the channel equalization filter 129 is coupled to additional receive processing 131 (demodulation, decoding, error correcting, synchronization, etc., etc. as is known) as well as on-channel AGC processes. The composite response of the filtering lineup through the receiver is arranged and configured to provide a bandwidth suitable for receiving the signal(s) of interest. Note that some or all of the digital filters or other digital signal processing may perform double duty, i.e., can be multiplexed between the I and Q channel signals thus saving some silicon area in an integrated circuit embodiment.

The on-channel AGC processes include in various embodiments an on-channel signal detector 123 or on-channel signal level detector that is configured to provide an on-channel signal level indication corresponding to a narrow band on-channel signal and as shown in exemplary form can be an on-channel power detector. The on-channel detector 123 given the on-channel signal at the output of the channel equalization filters 129, then filters this signal, I and Q channels with the high pass filter 132. The high pass filter in one embodiment is an Infinite Impulse Response (IIR) filter with a 3 dB corner around 200 Hz that operates to remove or reduce any residual DC component from the I and Q signal. Removing the DC components helps to stabilize the AGC loop as will be evident to those of ordinary skill.

The resultant filtered signal from the high pass filter 132 is coupled to a power estimator 133 that forms the sum of the squares of the I and Q signal (optionally can also take the square root of the sum) to provide a narrow band estimate (aka on-channel estimate or on-channel power estimate) corresponding to the on-channel signal level indication. Although it is expected that the signal power level at the antenna may vary 100+dB, the on-channel signal level should not vary as much and thus a linear scale at the output of the on-channel power estimator is typically satisfactory. The output of the power estimator (narrow band estimate or power estimate) is coupled to a narrow band loop filter 135. The loop filter 135 is an IIR filter that in one or more embodiments includes an adjustable pole that can be varied if needed to essentially trade off accuracy in favor of response time for the on-channel AGC loop. Furthermore the loop filter can operate as a known accumulate and dump filter or in a continuous integrate mode as will be further described below. The loop filter bandwidth and integration mode are adjustable via the OCD Loop BW signal 136 that in some embodiments is a 4 bit signal. The output of the loop filter is the on-channel signal level indication. In some embodiments the on-channel signal level indication is coupled to a comparison function 137. Essentially the on-channel signal level indication is compared with various thresholds, including a minimum on-channel threshold 138 to provide a pass/fail signal (output 139) indicating that the on-channel signal level is within a desired range (pass) or not (fail). The pass/fail signal at output 139 is essentially a binary on-channel signal level indication. This assessment includes hysteresis margins so that the on-channel AGC loop will not be subject to undue hunting. One of ordinary skill given a particular receiver architecture and receive signal protocol can readily determine the appropriate thresholds and hysteresis margins via experimentation. The comparison function also provides an on-channel detect (ocd) DONE signal (output 140) that is an indication of when a new on-channel estimate and appropriate comparisons have been made, i.e., the pass/fail signal is valid. The ocd DONE signal can be used to insure that the AGC system will not attempt to change the gain settings until a new on-channel power estimate is available when that is relevant (note: the delay for an on channel estimate is greater than the wide band channel).

As will be further described below and in stark contrast to many AGC systems, the on-channel detector and on-channel AGC system do not directly control the gain of the receiver. Rather this system provides an indication of whether the on-channel signal is at an appropriate level and this indication is a factor in determining whether and what gain adjustments should be made. Thus to summarize, we have described an on-channel detector that is configured to provide an on-channel signal level indication corresponding to an on-channel signal that can be relatively narrow band. The on-channel signal detector further comprises a narrow band filter (filters 127, 129) with an input coupled to a digital signal from an analog to digital converter 117 and an output coupled, via a high pass filter 132 that is operable to remove DC components and provide a filtered signal, to a power estimator 133 where the power estimator is configured to provide a narrow band estimate corresponding to the on-channel signal level indication. In some embodiments the on-channel signal detector further comprises an on-channel loop filter (alternatively referred to as a low pass filter) 135 that is coupled to the narrow band estimate and configured to provide the on-channel signal level indication where the loop filter can have a variable loop bandwidth suitable for adjusting on-channel signal level detector response times or other loop dynamics as will be appreciated. A comparator function converts the on-channel signal level indication to a digital on-channel signal level indication (pass/fail) indicative of an appropriate on-channel signal level or otherwise.

The wideband processing path or wideband signal detector 121 is arranged and configured to provide a wideband signal level indication, e.g., at output 148, corresponding to a wideband signal where the wideband signal includes the narrow band on-channel signal. The wideband signal detector can be referred to as a wideband AGC detector that in one or more embodiments can be a digital wideband AGC detector. The wideband detector path samples via ADC 117, filters via wideband filter 141 and high pass filter 143, and detects a wideband signal level of the I and Q channel signals via power estimator 145 to provide an assessment of the on-channel signal in combination with signals from adjacent channels. Due to the relatively higher bandwidth of the wideband signal detector and thus smaller delays, this wideband signal level indication can be available and used to control or adjust the gain of the receiver relatively faster than if only the, above discussed, on-channel detector is utilized.

In more detail and in various exemplary embodiments, the wideband signal detector 121 comprises the wideband filter 141 that in one embodiment are $3^{rd}$ order comb filters, e.g., a filter for each of the I and Q digital signals from the ADC 117. The wideband filter is a decimation filter architecture that down samples by a factor of 25. For example, with an input signal from the ADC 117 comprising 6 bit samples at a rate of 8.4 MS/s, the output of the wideband filter 141 will be a signal comprising 16 bit samples at a rate of 336 KS/s (9.6 MS/s, 6 bit samples is converted to 3.84 KS/s, 16 bits samples). A filter structure that provides a 3 dB bandwidth of 200 KHz and a 60 dB signal to noise ratio over the bandwidth has been used in one embodiment. Note that for processing efficiencies it may be appropriate to use comb filter stages from the decimation filter 127 for a portion of the wideband filter 141. For example in some embodiments, the wideband filter 141 implementation can use the signal at the third integration stage of the comb filter structure corresponding the decimation filter 127.

The outputs from the wideband filter 141 are coupled to a high pass filter (HPF) 143. The HPF 143 can be an IIR filter, finite impulse response (FIR) filter or other known filter architecture with a 3 dB corner frequency around 200 Hz. The HPF 143 can be implemented and operates similar to the high pass filter 132 and is arranged and configured to suppress or attenuate any DC signal component thus enhancing loop stability, etc. In addition the wideband detector can include an equalization filter (not shown) similar to the filter 129 although the transient time between accurate estimates may be greater if such a filter is included. Such a filter (droop compensation) would help to insure an accurate power measurement over the entire wideband estimator's bandwidth.

The outputs from the HPF 143 are coupled to a wideband power detector or power estimator 145, which is configured to provide a wideband estimate corresponding to the wideband signal level indication. The wideband signal detector, specifically the wideband power estimator 145 (further discussed below with reference to FIG. 2) further comprises a wideband loop filter that is coupled to the wideband estimate and configured to provide the wideband signal level indication at output 148. The wideband loop filter in some embodiments has a variable loop bandwidth suitable for adjusting wideband signal detector and wideband AGC loop response times and other loop dynamics as will be appreciated. The loop filter can also be set for continuous integration or an integrate and dump mode of operation. These characteristics are adjustable via the WBD Loop BW signal 144 and operating mode signal 142 for the wideband loop filter. In some embodiments, the loop bandwidth is controlled by a 4 bit signal that can be a setting established on initial receiver deployment or may be dynamically set via a general purpose controller to account for varying receiver requirements. The operating mode signal 142 is essentially a clear signal that initializes the loop filter and this signal is typically provided by a controller 149 (discussed below). Note also that the input signal to the wideband power estimator is a signal that has already been subjected to gain control. This is compensated for and thus the power estimator provides an output that reflects the amount or degree of gain control by feeding back to the power estimator the IF amplifier gain control state via a 4 bit signal 146 and the LNA gain control state via a 1 bit signal 147.

The wideband signal level indication at 148 is coupled to an AGC controller (controller) 149. Note that the controller is also coupled to the on-channel signal level indication, specifically a digital version thereof via the pass/fail signal 139 as well as the validity indication 140. Various other signals and parameters are also coupled to the controller 149. For example, signals such as AGC slot enable 150 and synchronization pass 151 are provided from the receiver modem and used by the controller 149 to determine a proper state to assume or to direct process flow all as will be further described. Parameters such as various thresholds and hysteresis variables are provided at 152. The controller 149 thus is coupled to the wideband signal level indication and the on-channel signal level indication, among others, and is further configured to provide a gain control signal 154 that corresponds to the wideband signal level and one or more of a plurality of states of the receiver. More particularly the gain control signal 154 includes a LNA gain setting or state 153 (1 bit signal designating LNA on or off) that is coupled to the switching arrangement 105 associated with the LNA and an IF amplifier gain setting or state 155 (4 bit signal designating one of 16 gain settings) that is coupled to the gain control input 113 of the IF amplifier. Note that the 4 mbit signal can be converted to an analog signal via a digital to analog converter (not shown) in one or more embodiments and the analog signal is then coupled to the gain control input 113. Note also that the gain control signals or settings for the LNA and IF amplifier are delayed appropriately by the controller 149 to account for various and corresponding receiver delays, such that the resultant gain control settings as well as subsequent signal level assessments will avoid undue transients in either the actual overall gain settings or assessed levels. The controller 149 provides the IF amplifier gain state 146 and LNA gain state 147 appropriately timed and relatively phased to insure the measured or assessed signal levels are accurate. This will be described in additional detail below.

The controller as noted above provides the gain control signal in accordance with the wideband signal level indication and one or a plurality of receiver states and further in some of these states subject to the on-channel signal level indication satisfying certain thresholds. Note that one path through the various states of the receiver is signal acquisition or attack, followed by signal synchronization and then signal tracking. For example, the controller can be further configured to provide the gain control signal in accordance with the wideband signal level when the receiver is in an initial signal acquisition state. Furthermore, the controller can be further configured to provide the gain control signal in accordance with the wideband signal level and the on-channel signal level, i.e., on-channel signal level must be above a target or threshold level, when the receiver is in a signal synchronization state. In another situation, the controller can be configured to provide the gain control signal in accordance with the wideband signal level and the on-channel signal level when the receiver is in a signal tracking state, wherein the gain control signal only decreases a gain of the receiver if the on-channel signal level is satisfactory. Specifically, in the signal tracking state, the gain of the LNA is not allowed to change and the IF amplifier can only decrease the gain of the receiver, so long as the on-channel signal level is above a threshold.

Figure 2:
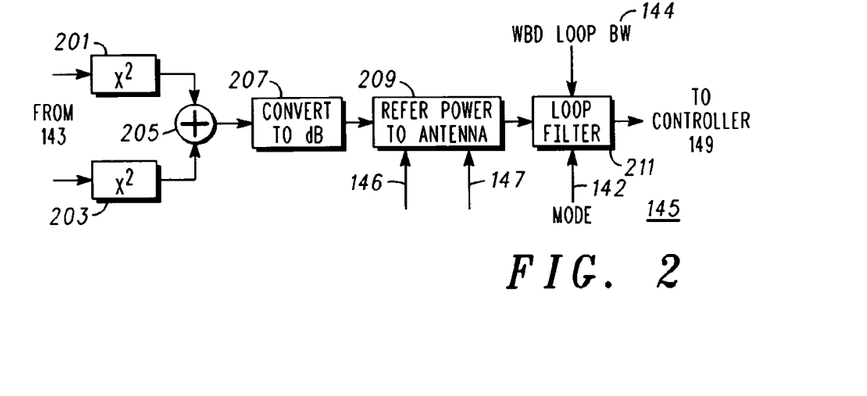
FIG. 2 shows an exemplary block diagram of a wideband signal detector suitable for use in the AGC system of FIG. 1 in accordance with the present invention.

Referring to FIG. 2, an exemplary block diagram of the wideband power estimator 145 suitable for use in the AGC system of FIG. 1 in accordance with the present invention will be briefly discussed and described. The wideband power estimator in one embodiment comprises a Sum-of-Squares function that includes squaring functions 201, 203 that are respectively coupled to the wideband filter 141 via the high pass filter 143 and operate to square on a sample by sample basis the I and Q outputs from the high pass filter 143. The resultant squares are added together at adder 205. The sum of squares from the output of the adder 205 are then converted to a dB value corresponding to the wideband signal level via one or more known techniques by the dB converter 207. The dB value is then adjusted by adding back whatever gain reduction is being applied by the LNA and IF amplifier at the normalization function 209. The amount of gain reduction being applied by the IF amplifier is reflected in the IF amplifier state information at 146 and similarly whether the LNA is on or off (off is 20 dB gain reduction in one or more embodiments) is reflected at 147. The output signal from the normalization function corresponds via a dB scale to the wideband signal power at the antenna. This output signal is coupled to a loop filter 211 and after filtering by the loop filter is coupled to the controller 149 as the wideband signal level indication. The loop filter 211 is similar to the loop filter 135 and as noted previously is adjustable in terms of operating bandwidth (144) and operating mode (142) as will be further discussed immediately below.

Figure 3:
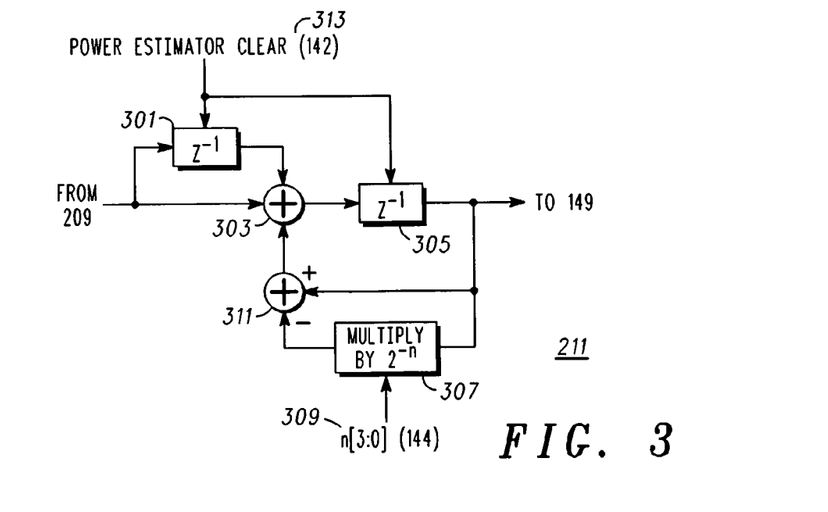
FIG. 3 illustrates an exemplary functional embodiment of a loop filter suitable for use in the AGC system of FIG. 1 in accordance with the present invention.

Referring to FIG. 3, an exemplary functional embodiment of a loop filter 211 suitable for use in the AGC system of FIG. 1 or wideband power detector 145 (or on-channel signal detector 123) in accordance with the present invention will be briefly discussed and described. The loop filter shown in FIG. 3 is an IIR filter with an input from 209 and an output that is coupled to the controller 149. The input signal from 209 is coupled to a delay stage 301 and an adder 303. The adder 303 adds a current sample, a last sample from 301 and a feedback signal together and couples the result to a delay stage 305. The output from the delay stage is coupled to the controller 149 and coupled back to an adder 311 and a multiplier 307. The multiplier 307 multiplies the output signal from the delay stage 313 by $2^{31\,n}$ ($\frac{1}{2}^n$) where n is provided at 309 as a 4 bit signal or any of 16 different values. Note that n at 309 corresponds to the WDB Loop BW signal 144. The output from the multiplier 307 is coupled to the adder 311. The adder adds the output signal from delay stage 305 and the output from the multiplier 307 and provides the result as the feedback signal to the adder 303. Those of ordinary skill will appreciate that with n=2 the 3 dB bandwidth of the loop filter 211 is approximately 15 KHz while with n=9 the 3 dB bandwidth is approximately 100 Hz with intermediate values for n yielding intermediate values for the 3 dB bandwidth. Generally each increase by 1 in the value of n results in halving the 3 dB bandwidth. Thus the bandwidth of the loop filter can be varied over a large range, if desired, resulting in large changes in loop response times as will be appreciated. Furthermore a clear signal 313 corresponding to the mode signal 142 can be used to clear the delay stages 301 and 303, thus changing the operating mode from a continuous integration mode (no clear signal) to an integrate and dump operating mode (clear signal).

Figure 4:
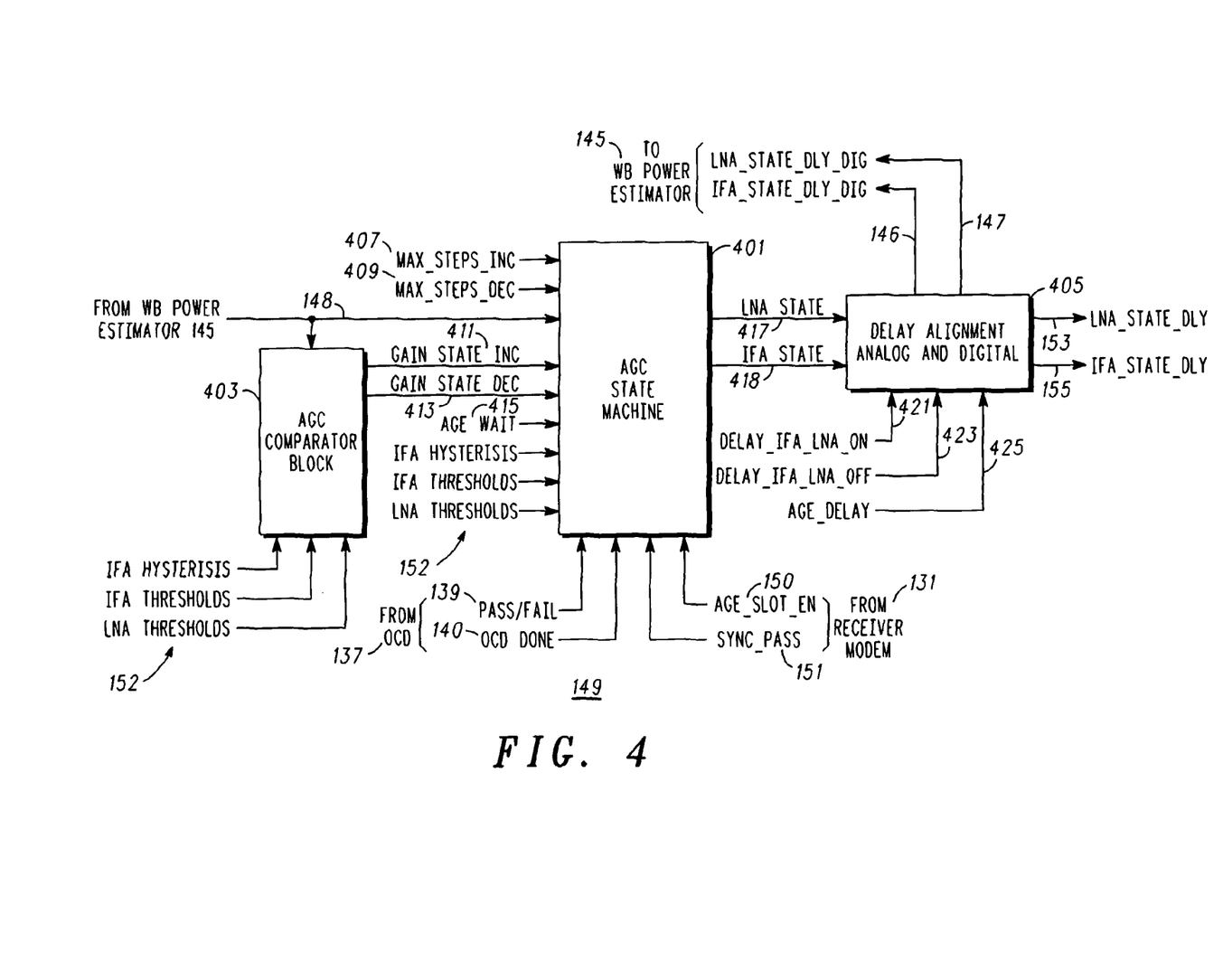
FIG. 4 illustrates a more detailed diagram of a controller suitable for use in the AGC system of FIG. 1 in accordance with the present invention.

Referring to FIG. 4, a more detailed diagram of one embodiment of the controller 149 that is suitable for use in the AGC system of FIG. 1 in accordance with the present invention will be briefly discussed and described. The controller 149 comprises a state machine 401, a comparator block 403 and a delay or phase alignment function 405 all intercoupled and communicating as depicted and further described. Note as will be appreciated by those of ordinary skill that the controller may be implemented in a general purpose processor that executes appropriate instructions (firmware or the like), hardware, or some combination of both. Furthermore the controller may provide other signals, e.g., mode signal 142, or be coupled to other signals, e.g., various control or status signals from a general receiver controller, that are not specifically shown but will be appreciated by those of ordinary skill.

The state machine 401 (alternatively AGC state machine) is coupled to various previously described signals, e.g., the pass/fail signal 139, ocd DONE indication 140 from the on-channel detector 123, wideband signal level indication 148 from the wideband power estimator 145 (P/O wideband signal detector 121) as well as AGC slot enable 150 and synchronization pass 151 from the receiver modem 131. The state machine 401 is also coupled to various other inputs or signal including LNA and IF amplifier thresholds and hysteresis information 152. Note that the threshold and hysteresis information 152 as well as wideband signal level indication 148 are also coupled to the comparator block 403. One or more additional parameters, e.g., maximum step size for an increase in gain 407 (e.g., in terms of number of discrete If amplifier steps), maximum step size for a decrease in gain 409 (number of discrete steps), and AGC wait parameter 415 which denotes a time delay after a change in the IF amplifier gain setting before the state machine is allowed to perform another update. Note that one or more of these parameters can vary depending, e.g., on the state of the state machine, loop filter bandwidth settings, whether the receiver gain is being increased or decreased, or the like.

Generally the comparator block 403 compares the wideband signal level indication (as referred to antenna signal levels) at 148 to a function of an IF amplifier threshold and IF amplifier hysteresis and provides as an input to the state machine 401, information suitable for establishing gain states of the LNA and IF amplifier if the signal at the antenna is increasing (gain state inc 411) or if the signal is decreasing (gain state dec 413). For example, for a desired signal level and a hysteresis value, the comparator block will compare the wideband signal level indication to a series of overlapping values comprising the desired signal level (ifa threshold) +/−½ of the hysteresis value+n times IF amplifier step size, e.g., 2.5 dB. Which of the values the wideband signal level indication falls within and whether the gain needs to be increased or decreased to obtain or move toward the desired signal level will result in a new gain setting for the IF Amplifier and LNA. This will be reflected in gain state inc at 411 or gain state dec at 413.

The state machine 401 is coupled to the gain state signals at 411, 413 as well as the wideband signal level indication at 148 and the other signals and parameters noted above. While various approaches are contemplated, one embodiment provides 4 possible IF amplifier states as the gain state signals 411, 413. These include two IF amplifier states if the LNA is ON or active that correspond, respectively, to signal decreasing or increasing and two IF amplifier states if the LNA is OFF that correspond, respectively to signal decreasing or increasing. In this instance, the state machine is responsible for determining whether the LNA is or should remain ON or OFF, whether the signal level is decreasing or increasing, and thus selection of the appropriate IF amplifier state from among the four choices. The state machine uses some or all of these inputs together with one of a plurality of states as determined in part from the agc slot enable and sync pass signals 150, 151 to provide the appropriate LNA signal or state (on/off) at 417 and IF Amplifier signal or state (1 of 16 possibilities) at 419.

These IF and LNA states at 417, 419 are coupled to the phase alignment function 405 together with various delay parameters at 421, 423, 425. The delay parameters include a delay for the IF amplifier when the LNA is on at 421. This delay is applied before an update to the gain of the IF amplifier is applied when the LNA is on. Also included is a delay for the IF amplifier when the LNA is off at 423. This delay is applied before an update to the gain of the IF amplifier is applied when the LNA is off. Typically the delay at 423 will exceed the delay at 421. These delays facilitate a smooth gain change for the overall receiver when the LNA is switched from one state to another (changing gain by 20 dB) and the IF amplifier is switched a large number of steps (7×2.5 dB=17.5 dB) in the opposite direction to effect a smooth change in overall receiver gain. Another delay parameter is AGC delay at 425 which specifies the delay from the IF amplifier to the wideband signal detector. Note that all of these delays in one or more embodiments are specified in terms of clock cycles for the underlying processes, e.g., 2.98 microseconds for 8.4 MHz reference and 2.6 micro seconds with a 9.6 MHz reference. The phase alignment function generates the gain control signal 154 including a LNA gain setting or state 153 (1 bit signal designating LNA on or off) and an IF amplifier gain setting or state 155 (4 bit signal designating one of 16 gain settings) each appropriately delayed and also generates and provides the IF amplifier gain control state via a 4 bit signal at 146 and the LNA gain control state via a 1 bit signal at 147 again appropriately phased or delayed. The signal at 146, 147 are coupled to the wideband power estimator 145 as noted above.

Figure 5:
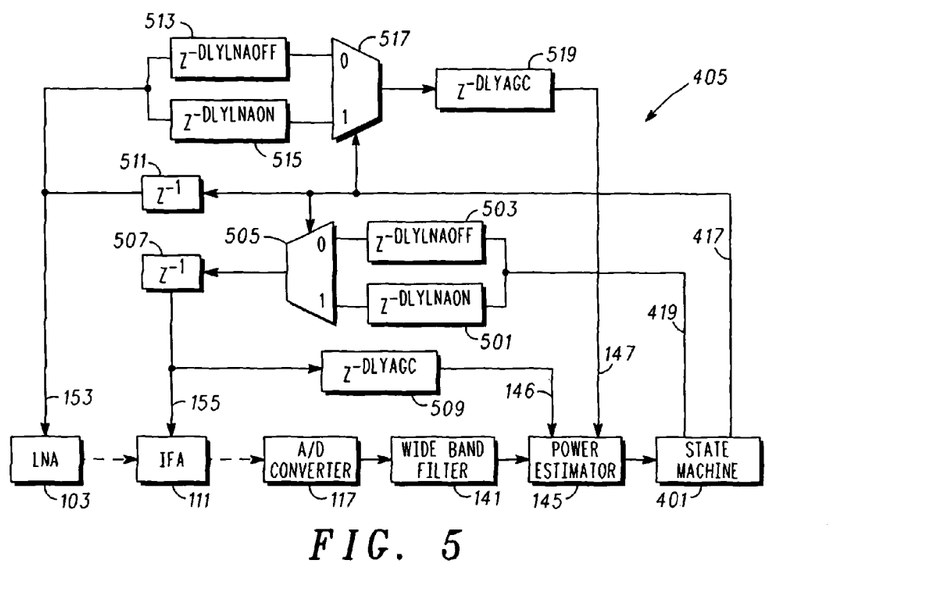
FIG. 5 depicts a functional block diagram of a phase or delay alignment function suitable for use in the controller of FIG. 4 in accordance with the present invention.

Referring to FIG. 5, a functional block diagram of a delay or phase alignment function suitable for use in the controller of FIG. 4 in accordance with the present invention will be briefly discussed and described. A simplified lineup of several of the functions discussed above is shown near the bottom of FIG. 5. These functions include some of the more relevant functions for purposes of explaining the phase alignment function 405 including the LNA 103, IF amplifier 111, ADC 117, wideband filter 141, wideband power estimator 145, and state machine 401. Also depicted is a more detailed diagram of the phase alignment function 405. Various of the signals and the like noted above are also observed, including LNA gain state or setting 153 coupled to a gain control input of the LNA, IF amplifier gain state or setting 155 coupled to a gain control input of the IF amplifier, IF and LNA states at 417, 419 output from the state machine, and IF amplifier gain control state 146 and LNA gain control state 147 coupled to the wideband power estimator.

The IF amplifier state at 419 is coupled to delay stages 501, 503. The delay stage 501 is programmed to add a delay corresponding to the delay parameter at 421 and the delay stage 503 is programmed to add a delay corresponding to the delay parameter at 423. The output from each of delay stages 501, 503 is coupled to a multiplexer 505 and will be available in accordance with the respective delays of the delay stages 501, 503. The LNA state at 417 is coupled to and used to control the multiplexer 505, such that when the LNA state is "0" the output of delay stage 503 is coupled to a delay stage 507 and when the LNA state is "1" the output of delay stage 501 is coupled to the delay stage 507. The LNA state at 417 is also coupled to a delay stage 511. The delay stage 507 and 511 apply 1 unit (process clock cycle) delay and thus the output of delay stage 511, i.e., LNA gain setting 153, is used to control the gain of the LNA one delay unit after a change in the LNA state at 417 while the corresponding IF amplifier state at 419 is available at the output of delay stage 507, i.e., IF amplifier gain setting 155, to control the IF amplifier gain after an additional delay (delay stage 501 or 503 delay) that depends on whether the LNA is being turned ON (stage 501) or OFF (stage 503).

The IF amplifier gain setting at 155 is also coupled to a further delay stage 509 that is programmed with the delay parameter at 425 and the output of delay stage 509 is coupled to the power estimator 145 as the IF amplifier gain control state 146. Thus any changes in IF amplifier gain are reflected in the wideband power estimate after a delay that more or less equals the delay from the IF amplifier to the wideband power detector. The LNA gain setting 153 is also coupled to delay stages 513, 515 and these are, respectively, analogous to delay stages 503, 501. The outputs of delay stages 513, 515 are coupled to a multiplexer 517 that is controlled by the LNA state 417 and operates analogously to the multiplexer 505. The output from the multiplexer 517 is coupled to delay stage 519 that is analogous to delay stage 509 and the output from this delay stage is coupled to the power estimator 145 as the LNA gain control state 147. By observation it will be evident that the total delay between a change in the gain control settings for the LNA and IF amplifier and when those changes are reflected at the wideband power estimator are equal. Overall this attention to these various delays allows the AGC for the receiver to operate with minimal transient effects.

Figure 6:
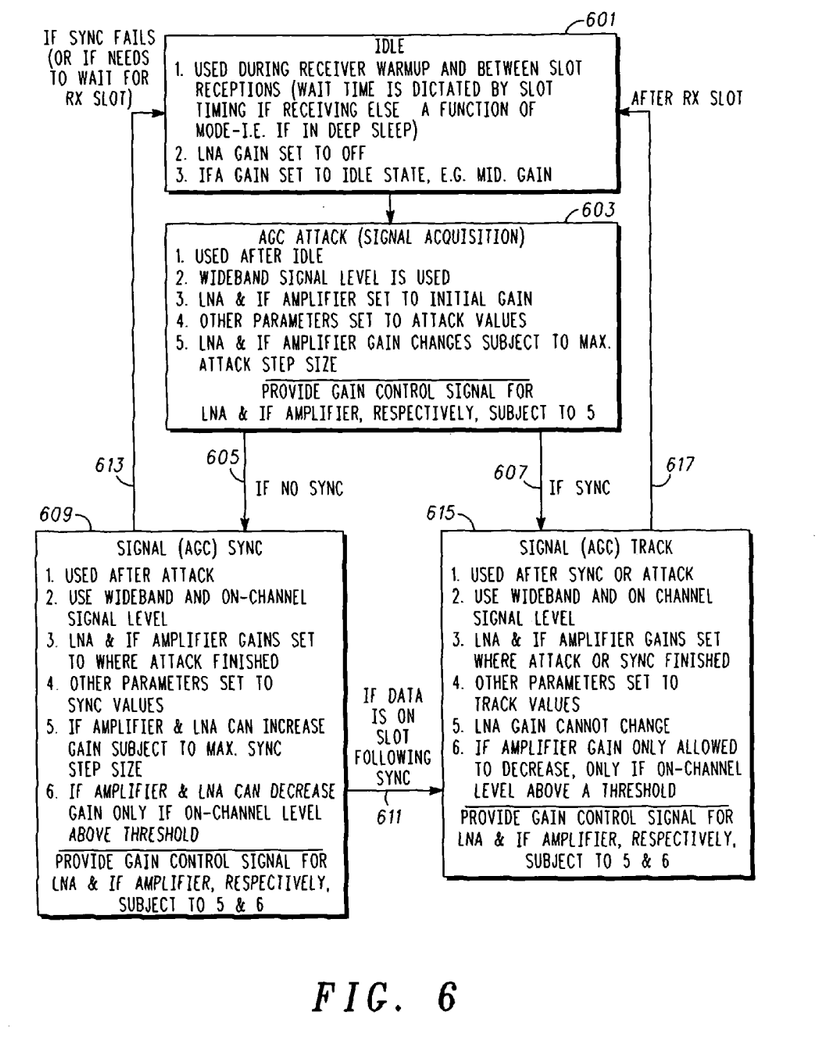
FIG. 6 illustrates a state diagram that illustrates various embodiments of methods of facilitating AGC in a receiver in accordance with the present invention.

Referring to FIG. 6 a state diagram that illustrates various embodiments of methods of facilitating AGC in a receiver in accordance with the present invention will be briefly discussed and described. Generally, FIG. 6 shows 4 states for the receiver or specifically AGC system. These states include an IDLE state 601 which is entered during receiver warm-up, e.g. during a power up sequence, between receive slots, if SYNC is lost or fails, or when the receiver is in a deep sleep mode (deep sleep mode is entered or corresponds to those instances when the receiver is not receiving any signal and this mode facilitates battery saving since most functions are mostly shutdown most of the time). The time duration of the IDLE state will depend on slot timing or other protocol considerations.

After IDLE the AGC system or receiver enters a signal acquisition state 603 or AGC ATTACK state where the time of entry will depend on protocol slot timing or the like and may be signaled or indicated by the AGC enable signal at 150. This state is used to make rapid receiver gain adjustments upon initial signal reception on a given frequency. In the signal acquisition state, the wideband signal detector is used to determine the wideband signal level indication and this indication is used to provide a corresponding gain control signal. Note that the gain of the LNA and IF amplifier can be set to an initial attack value, e.g., LNA off and IF amplifier at a mid gain point, or the gains can be set to the last LNA and IF amplifier values from a SYNC, TRACK, or ATTACK state where these values are further discussed below. The gain control signal includes a first gain control signal (LNA gain setting 153) suitable for controlling the gain of the LNA and a second gain control signal (IF amplifier gain setting 155) suitable for controlling the gain of the IF amplifier. Note: that in the signal acquisition state in one or more embodiments, the gain of the IF amplifier and LNA can be adjusted to any setting that is needed (for a given signal level). However the adjustments are subject to a maximum allowed step size (increase or decrease), and thus to arrive at a final gain setting, the state machine may require multiple cycles or updates to the gain settings. Furthermore parameters discussed earlier, such as the max step sizes 407, 409, hysteresis range (P/O 152), power estimator bandwidth 144 (loop filter bandwidth 309), AGC wait 415, etc. may also be set to particular values corresponding to the signal acquisition state. In one or more embodiments, the signal acquisition state last a predetermined period of time, e.g., 360 micro seconds and during this time the AGC system may make several signal level estimates and corresponding gain changes.

After the signal acquisition state, the AGC system or receiver enters either 605 a signal synchronization (SYNC) state 609 or enters 607 a signal tracking state 615. As will become evident below, if the receiver has already acquired synchronization (e.g., during an earlier receive slot) the system goes immediately to the signal tracking state 615, however if SYNC has not been obtained or acquired (e.g., initial signal acquisition activity or SYNC has been lost) the state machine enters the SYNC state 609). The SYNC state allows the receiver frequency and time references (frame and symbol) to be aligned with the signal that is being received as is known. In the SYNC state both the wideband signal detector and thus wideband signal level indication and the on-channel signal detector and thus on-channel signal level indication are utilized. The LNA and IF amplifier gains are set to where or left where they were when the signal acquisition state was exited. The other parameters, such as those noted above including max step sizes (increase and decrease) are set to values that can be specific to the SYNC state. In the SYNC state the IF amplifier and LNA are allowed to increase in gain to any amount indicated by the wideband signal level indication in any one step subject to the maximum step size. The IF amplifier and LNA can decrease gain if indicated but only so long as the on-channel signal level indication is sufficient to satisfy a threshold. Generally, the SYNC state lasts for a predetermined time period that will be protocol specific, e.g., 180 micro seconds in one embodiment.

The purpose of or result of the SYNC state in terms of the AGC system is to provide a gain control signal for the LNA and IF amplifier subject to the rules noted above. More generally, during the signal synchronization state, providing the gain control signal is responsive to the plurality of receiver states being a signal synchronization state, and the gain control signal is dependent on the wideband signal level where any gain reductions are subject to the on-channel signal level indication satisfying a threshold. The gain control signal includes a gain control signal (LNA gain setting 153) suitable for controlling the gain of the LNA and gain control signal (IF amplifier gain setting 155) suitable for controlling the gain of the IF amplifier.

After the signal synchronization state, the state machine or process depicted in FIG. 6 may return 613 to the IDLE state 601 and wait for a receive slot or move directly 611 to a signal tracking state 615 if there is payload or data within the slot containing the synchronization information. Note also if SYNC fails or is lost the process also goes to the IDLE state to wait for the next attempt. SYNC success can be indicated by the SYNC pass signal at 151.

Thus the signal tracking state 615 is entered 611 after the signal synchronization state or is entered 607 after the signal acquisition state 603 (If SYNC has already been acquired). The signal tracking state is used and is the normal state for the AGC while receiving payload or data during a desired receive time/frequency slot. The duration of the tracking mode is normally the duration of the receive slot, unless for some reason the signal is lost during this slot. When the tracking state is exited the process returns to the IDLE state, typically until the next receive slot. This state uses both the wideband signal level indication and the on-channel signal level indication. The initial state of the LNA and IF amplifier in the tracking state is the same gain they were set to at the end of the signal acquisition or signal synchronization state. Other parameters as noted above are set to there respective signal tracking values.

In the signal tracking state in one or more embodiments the LNA gain is not allowed to change. The IF amplifier gain can change but in some embodiments can only decrease and any decreases are subject to the on-channel signal level indication satisfying a threshold, e.g., exceeding a threshold. Thus generally the AGC system during the tracking state will provide the gain control signal dependent on the wideband signal level with any gain reductions subject to the on-channel signal level indication satisfying a threshold. The gain control signal includes a gain control signal that is suitable for maintaining the gain of a low noise amplifier (i.e., no change is allowed) during the signal tracking state and a gain control signal suitable for controlling, e.g., reducing as appropriate, the gain of an Intermediate Frequency (IF) amplifier.

The apparatus discussed and described above with reference to FIG. 1-FIG. 5 as well as the state diagram of FIG. 6 can be advantageously utilized to implement a system that is arranged and constructed to provide AGC for a receiver as well as various methods of AGC in a receiver. Note that much or all of the apparatus can be advantageously implemented in one or more integrated circuits and thus the methods can be practiced by or within an integrated circuit. In summary, one embodiment of the system includes an on-channel AGC detector that is configured to provide an on-channel power or signal level indication corresponding to an on-channel signal, where the on-channel signal level indication can correspond to whether the on-channel signal level satisfies a threshold, and a wideband AGC detector that is configured to provide a wideband power indication that corresponds to a wideband signal, where the wideband signal includes the on-channel signal. Further included is a controller that is coupled to the wideband AGC detector and the on-channel AGC detector. The controller is arranged and configured to provide a first gain control signal that is suitable for controlling a gain of a low noise amplifier that is included in the receiver and to provide a second gain control signal that is suitable for controlling a gain of an Intermediate Frequency (IF) amplifier included in the receiver. The first and second gain control signal are dependent on one of a plurality of states of the receiver. The controller can be further configured to provide the first gain control signal suitable for one of enabling and disabling the low noise amplifier and the second gain control signal for selecting one of a multitude of gains for the IF amplifier. The controller may further comprise a delay alignment function that is configured to phase align any changes in the first and the second gain control signal in accordance with respective delays in corresponding gain changes in the receiver.

Various of the methods will be described briefly below in the nature of a summary. Although these methods will be discussed with reference to FIG. 1-FIG. 5 when a context is appropriate, it will be appreciated that while the methods may be practiced in the FIG. 1-FIG. 5 apparatus, they may also be embodied in or practiced by other suitably configured apparatus, provided concepts or principles in accordance with the FIG. 6 state diagram and the discussions below are utilized. The method of facilitating automatic gain control (AGC) in a receiver, as an overview includes determining an on-channel signal level indication corresponding to a narrow band on-channel signal and determining a wideband signal level indication, corresponding to a wideband signal, where the wideband signal includes the narrow band on-channel signal. Further included is providing, responsive to at least one of a plurality of receiver states, a gain control signal that is dependent on at least one of the wideband signal level indication and the on-channel signal level indication.

In one embodiment, the determining the wideband signal level includes filtering a signal from the receiver with a wideband filter to provide the wideband signal; high pass filtering the wideband signal to attenuate low frequency components and provide a filtered signal; estimating a level of the filtered signal to provide a wideband estimate that corresponds to the wideband signal level indication (in some embodiments the wideband estimate can be converted to a logarithmic scale); and low pass filtering the wideband estimate with a loop filter to provide the wideband signal level estimate. Similarly, the determining the on-channel signal level indication includes filtering a signal from the receiver with a narrow band filter to provide the narrow band on-channel signal; high pass filtering the narrow band on-channel signal to reduce low frequency components and to provide a filtered signal; estimating a level of the filtered signal to provide an on-channel estimate that corresponds to the on-channel signal level indication; and low-pass filtering the on-channel estimate with a low pass or loop filter to provide the on-channel signal level indication. Note that in some embodiments the result or output from the low pass filter is compared to a threshold and as long as the threshold is satisfied the on-channel signal level indication or on-channel signal status or level is positive and thus deemed sufficient.

The providing the gain control signal in some embodiments includes providing a first gain control signal that is suitable for controlling the gain of a low noise amplifier and a second gain control signal suitable for controlling the gain of an Intermediate Frequency (IF) amplifier, where any changes in the first gain control signal and the second gain control signal are coordinated to provide a continuous gain change for the overall gain of the receiver. The providing the gain control signal can advantageously further include phasing any changes in the first gain control signal and the second gain control signal in accordance with respective delays in corresponding gain changes in the receiver. The providing the gain control signal can also include providing a first gain control signal that is suitable for controlling the gain of a low noise amplifier and a second gain control signal suitable for controlling the gain of an Intermediate Frequency (IF) amplifier; and when the at least one of a plurality of receiver states further comprises: a signal acquisition state, providing the gain control signal in accordance with the wideband signal level indication; a signal synchronization state, providing the gain control signal in accordance with the wideband signal level indication, wherein the gain control signal is only allowed to decreases a gain of the receiver when the on-channel signal level indication satisfies a threshold; and a signal tracking state, providing the gain control signal in accordance with the wideband signal level indication, wherein the gain control signal is only allowed to change the second gain control signal and only allowed to decrease the gain of the receiver when the on-channel signal level indication satisfies a further threshold.

It will be appreciated by those of ordinary skill that the above described receiver and AGC systems will also include a general purpose controller to generally control the receiver and AGC system. For example this controller would normally control whether the receiver is operational, e.g., whether a receive slot is present or whether a check should be made, and the frequency of the local oscillator vis-à-vis programming a synthesizer, etc. This controller has not been shown or described in order to minimize any risk of obscuring the principles and concepts according to the present invention.

Figure 7:
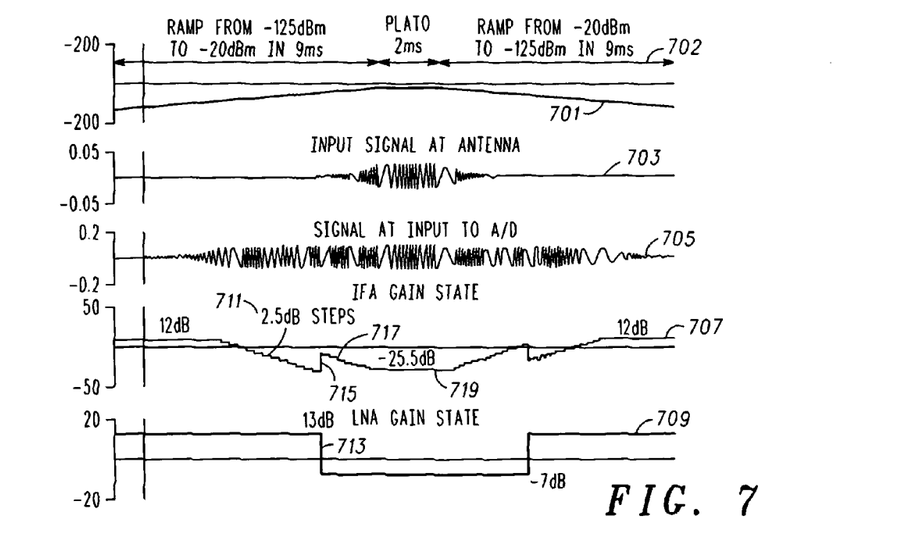
FIG. 7 illustrates various performance data of a simulated AGC system.

Referring to FIG. 7, various performance data that was collected via system simulation is shown. FIG. 7 illustrates a situation where the input power 701 ramps up and then down according to the time line 702. Specifically the input power ramps up from −125 dBm to −20 dBm in 9 mille-seconds (ms), stays constant at −20 dBm for 2 ms, and then ramps down to −125 dBm over the next 9 ms 702. The signal 703 at the antenna is shown for reference. The signal (real) 705 at the input to the ADC is shown and very little peaking or other discontinuities are observed given the operation of the AGC including gain replacement. The gain of the IF amplifier 707 and the relationship to the gain of LNA 709 is depicted. The IF amplifier gain is shown with the gain decreasing in 2.5 dB steps from 12 dB to −25.5 dB 711 at which point the LNA gain 709 decreases by 20 dB (13 dB to −7 dB) and the IF amplifier gain increases by 17.5 dB 715 and then continues to decrease in 2.5 dB steps 717 to −25.5 dB 719. As the input power 701 at the antenna decreases the gain of the LNA and IF amplifier increase in more or less reverse order to the process of decreasing. Note that since the power is ramping up and down gradually the individual gain steps of the IF amplifier can be seen. Under other conditions, such as a sudden application of a signal, the IF amplifier could make one step of 37.5 dB if needed assuming the maximum allowed step size was that large. Suppose, for example, that an IF amplifier gain reduction of 15 dB was required and the allowed step size was limited to 10 dB, we would observe a 10 dB change followed by a 5 dB change in the IF amplifier gain.

An automatic gain control system for a receiver that is arranged and constructed to provide gain control for a receiver and mitigate the undue delay of narrow band on-channel signal detectors and thus the resultant effects in receivers with limited selectivity for much of the analog processing functions has been discussed and described. Generally the automatic gain control advantageously uses a conventional on-channel detector as well as a wideband detector and controllers that cooperatively operate to provide relatively quickly an appropriate gain control signal when a wideband signal including an on-channel signal is present and also operate to avoid reducing gain to the point that the on-channel signal processing would be adversely effected.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An automatic gain control system for a receiver comprising:
   an on-channel signal detector configured to provide an on-channel signal level indication corresponding to a narrow band on-channel signal;
   a wideband signal detector including a wideband filter and configured to provide a wideband signal level indication corresponding to a wideband signal, the wideband signal including the narrow band on-channel signal; and
   a controller, coupled to the wideband signal level indication and the on-channel signal level indication, configured to provide a gain control signal corresponding to the wideband signal level and one or more of a plurality of states of the receiver,
   wherein the wideband filter has an input coupled to a digital signal from an analog to digital converter and an output coupled to a power estimator, the power estimator configured to provide a wideband estimate corresponding to the wideband signal level indication.

2. The automatic gain control system of claim 1 wherein the wideband signal detector further comprises a wideband loop filter coupled to the wideband estimate and configured to provide the wideband signal level indication, the wideband loop filter further having a variable loop bandwidth suitable for adjusting wideband signal detector response times.

3. The automatic gain control system of claim 1 wherein the on-channel signal detector further comprises a narrow band filter with an input coupled to the digital signal from the analog to digital converter and an output coupled to a further power estimator, the further power estimator configured to provide a narrow band estimate corresponding to the on-channel signal level indication.

4. The automatic gain control system of claim 3 wherein the on-channel signal detector further comprises a low pass filter coupled to the narrow band estimate and configured to provide the on-channel signal level indication, the low pass filter further having a variable bandwidth suitable for adjusting on-channel signal level detector response times.

5. The automatic gain control system of claim 1 wherein the controller is further configured to provide the gain control signal in accordance with the wideband signal level indication when the receiver is in a signal acquisition state.

6. The automatic gain control system of claim 1 wherein the controller is further configured to provide the gain control signal in accordance with the wideband signal level indication and subject to the on-channel signal level indication satisfying a threshold when the receiver is in a signal tracking state, wherein the gain control signal only decreases a gain of the receiver.

7. An automatic gain control system for a receiver comprising:
   an on-channel signal detector configured to provide an on-channel signal level indication corresponding to a narrow band on-channel signal;
   a wideband signal detector including a wideband filter and configured to provide a wideband signal level indication corresponding to a wideband signal, the wideband signal including the narrow band on-channel signal; and
a controller, coupled to the wideband signal level indication and the on-channel signal level indication, configured to provide a gain control signal corresponding to the wideband signal level and one or more of a plurality of states of the receiver,
   wherein the controller is further configured to provide the gain control signal in accordance with the wideband signal level indication and subject to the on-channel signal level indication satisfying a threshold when the receiver is in a signal synchronization state.

8. A method of facilitating automatic gain control (AGC) in a receiver, the method comprising:
   determining an on-channel signal level indication corresponding to a narrow band on-channel signal;
   filtering a signal from the receiver with a wideband filter to provide a wideband signal
   determining a wideband signal level indication, corresponding to the wideband signal, the wideband signal including the narrow band on-channel signal; and
   providing, responsive to at least one of a plurality of receiver states, a gain control signal that is dependent on at least one of the wideband signal level indication and the on-channel signal level indication,
   wherein the providing the gain control signal further comprises providing the gain control signal responsive to the one of a plurality of receiver states including a signal tracking state, the gain control signal dependent on the wideband signal level with any gain reductions subject to the on-channel signal level indication satisfying a threshold, the gain control signal including a first gain control signal that is suitable for maintaining the gain of a low noise amplifier during the signal tracking state and a second gain control signal suitable for controlling the gain of an Intermediate Frequency (IF) amplifier.

9. The method of claim 8 wherein the determining the wideband signal level further comprises:
   high pass filtering the wideband signal to attenuate low frequency components and provide a filtered signal;
   estimating a level of the filtered signal to provide a wideband estimate that corresponds to the wideband signal level indication; and
   low pass filtering the wideband estimate with a loop filter to provide the wideband signal level estimate.

10. The method of claim 8 wherein the determining the on-channel signal level indication further comprises:
   filtering a signal from the receiver with a narrow band filter to provide the narrow band on-channel signal;
   high pass filtering the narrow band on-channel signal to provide a filtered signal;
   estimating a level of the filtered signal to provide an on-channel estimate that corresponds to the on-channel signal level indication; and
   low-pass filtering the on-channel estimate with a loop filter and comparing the result to a threshold to provide the on-channel signal level indication.

11. The method of claim 8 wherein the providing the gain control signal further comprises providing the gain control signal responsive to the one of a plurality of receiver states including a signal acquisition state, the gain control signal dependent on the wideband signal level, the gain control signal including a first gain control signal suitable for controlling the gain of a low noise amplifier and a second gain control signal suitable for controlling the gain of an Intermediate Frequency (IF) amplifier.

12. The method of claim 8 wherein the providing the gain control signal further comprises providing the gain control signal responsive to the one of a plurality of receiver states including a signal synchronization state, the gain control signal dependent on the wideband signal level with any gain reductions subject to the on-channel signal level indication satisfying a threshold, the gain control signal including a first gain control signal suitable for controlling the gain of a low noise amplifier and a second gain control signal suitable for controlling the gain of an Intermediate Frequency (IF) amplifier.

13. The method of claim 8 wherein the providing the gain control signal further comprises providing a first gain control signal that is suitable for controlling the gain of a low noise amplifier and a second gain control signal suitable for controlling the gain of an Intermediate Frequency (IF) amplifier, where any changes in the first gain control signal and the second gain control signal are coordinated to provide a continuous gain change for the overall gain of the receiver.

14. The method of claim 13 wherein the providing the gain control signal further comprises phasing any changes in the first gain control signal and the second gain control signal in accordance with respective delays in corresponding gain changes in the receiver.

15. The method of claim 8 wherein the providing the gain control signal further comprises:
   providing a first gain control signal that is suitable for controlling the gain of a low noise amplifier and a second gain control signal suitable for controlling the gain of an Intermediate Frequency (IF) amplifier; and
   when the at least one of a plurality of receiver states further comprises:
      a signal acquisition state, providing the gain control signal in accordance with the wideband signal level indication;
      a signal synchronization state, providing the gain control signal in accordance with the wideband signal level indication, wherein the gain control signal is only allowed to decreases a gain of the receiver when the on-channel signal level indication satisfies a threshold; and
      the signal tracking state, providing the gain control signal in accordance with the wideband signal level indication, wherein the gain control signal is only allowed to change the second gain control signal and only allowed to decrease the gain of the receiver when the on-channel signal level indication satisfies a further threshold.

16. A system arranged and constructed to provide automatic gain control (AGC) for a receiver, the system comprising:
   a on-channel AGC detector configured to provide an on-channel signal level indication corresponding to an on-channel signal, the on-channel signal level indication corresponding to whether the on-channel signal level satisfies a threshold;
   a wideband AGC detector configured to provide a wideband power indication, corresponding to a wideband signal, the wideband signal including the on-channel signal; and a controller coupled to the wideband AGC detector and the on-channel AGC detector, the controller configured to provide a first gain control signal suitable for controlling a gain of a low noise amplifier included in the receiver and to provide a second gain control signal suitable for controlling a gain of an Intermediate Frequency (IF) amplifier included in the receiver, the first and second gain control signal dependent on one of a plurality of states of the receiver, wherein the controller is further configured to provide the first gain control signal suitable for one of enabling and disabling the low noise amplifier and the second gain control signal for selecting one of a multitude of sins for the IF amplifier.

17. The system of claim 16 wherein the controller further comprises a delay alignment function configured to phase align any changes in the first and the second gain control signal in accordance with respective delays in corresponding gain changes in the receiver.

* * * * *

UNITED STATES PATENT AND TRADEMARK OFFICE
CERTIFICATE OF CORRECTION

PATENT NO. : 7,929,650 B2
APPLICATION NO. : 11/252525
DATED : April 19, 2011
INVENTOR(S) : Sobchak et al.

It is certified that error appears in the above-identified patent and that said Letters Patent is hereby corrected as shown below:

Column 20 line 2 after the word "of" please delete "sins" and insert --gains--

Signed and Sealed this
Fifth Day of July, 2011

David J. Kappos
*Director of the United States Patent and Trademark Office*